US008007255B2

(12) United States Patent
Hattori et al.

(10) Patent No.: US 8,007,255 B2
(45) Date of Patent: Aug. 30, 2011

(54) INVERTER-INTEGRATED ELECTRIC COMPRESSOR WITH INVERTER STORAGE BOX ARRANGEMENT

(75) Inventors: Makoto Hattori, Kiyosu (JP); Takayuki Takashige, Kiyosu (JP); Kazuki Niwa, Kiyosu (JP); Koji Nakano, Nagoya (JP); Shunsuke Yakushiji, Nagoya (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 810 days.

(21) Appl. No.: 11/704,222

(22) Filed: Feb. 9, 2007

(65) Prior Publication Data
US 2008/0116838 A1 May 22, 2008

(30) Foreign Application Priority Data

Nov. 22, 2006 (JP) ................................. 2006-315771
Nov. 22, 2006 (JP) ................................. 2006-315772

(51) Int. Cl.
*F04B 17/00* (2006.01)
*H02K 5/00* (2006.01)
*H02K 9/00* (2006.01)
*H02B 1/26* (2006.01)
*H05K 7/20* (2006.01)

(52) U.S. Cl. ......... 417/410.1; 310/89; 310/71; 310/55; 310/68 R; 361/624; 361/704; 363/144

(58) Field of Classification Search ............... 417/410.1; 62/228.4; 361/699, 704, 707, 639, 676, 690, 361/624; 363/146, 144; 310/89, 71, 68 R, 310/54, 55, 52; 257/731, 276; 174/252
See application file for complete search history.

(56) References Cited

U.S. PATENT DOCUMENTS

| 5,057,971 A | * | 10/1991 | Hautvast et al. | ............... 361/740 |
| 5,253,143 A | * | 10/1993 | Klinger et al. | ................ 361/736 |
| 5,533,905 A | * | 7/1996 | Hio et al. | ..................... 439/76.2 |
| 5,675,223 A | * | 10/1997 | Yoshizawa et al. | ........... 318/139 |
| 5,777,844 A | * | 7/1998 | Kiefer | ............................ 361/704 |

(Continued)

FOREIGN PATENT DOCUMENTS

JP 2003-153552 5/2003

(Continued)

OTHER PUBLICATIONS

Machine Translation of JP2004190547A.*

(Continued)

*Primary Examiner* — Devon C Kramer
*Assistant Examiner* — Nathan Zollinger
(74) *Attorney, Agent, or Firm* — Wenderoth, Lind & Ponack, L.L.P.

(57) ABSTRACT

An inverter-integrated electric compressor enhances vibration resistance of an inverter apparatus integrated with a housing without degrading cooling performance, reduction in weight, or the ease of assembly of the inverter apparatus. An inverter-integrated electric compressor has an inverter apparatus integrated with an inverter storage box of housing. The inverter apparatus includes a metal plate secured in an inverter storage box, a plurality of power semiconductor switching elements mounted on the metal plate, a power substrate on which a power-related control circuit for operating the power semiconductor switching elements is mounted, and a busbar assembly formed by integrating a plurality of busbars with an insulator. The metal plate includes a protrusion extending in a width direction perpendicular to a motor shaft direction of an electric motor.

20 Claims, 9 Drawing Sheets

U.S. PATENT DOCUMENTS

| | | | |
|---|---|---|---|
| 5,949,648 A * | 9/1999 | Liao | 361/700 |
| 6,091,604 A * | 7/2000 | Plougsgaard et al. | 361/707 |
| 6,166,937 A * | 12/2000 | Yamamura et al. | 363/141 |
| 6,198,183 B1 * | 3/2001 | Baeumel et al. | 310/52 |
| 6,377,462 B1 * | 4/2002 | Hajicek et al. | 361/719 |
| 6,421,244 B1 * | 7/2002 | Shinohara et al. | 361/736 |
| 6,501,662 B2 * | 12/2002 | Ikeda | 361/760 |
| 6,552,912 B1 * | 4/2003 | Kanazawa et al. | 361/752 |
| 6,583,988 B1 * | 6/2003 | Lyons et al. | 361/719 |
| 6,661,659 B2 * | 12/2003 | Tamba et al. | 361/699 |
| 6,690,582 B2 * | 2/2004 | Sumida | 361/752 |
| 6,808,372 B2 * | 10/2004 | Makino et al. | 417/410.5 |
| 6,822,353 B2 * | 11/2004 | Koga et al. | 310/64 |
| 6,898,072 B2 * | 5/2005 | Beihoff et al. | 361/676 |
| 6,987,670 B2 * | 1/2006 | Ahmed et al. | 361/699 |
| 7,009,318 B2 * | 3/2006 | Iritani et al. | 310/58 |
| 7,021,075 B2 * | 4/2006 | Shindo et al. | 62/259.2 |
| 7,030,520 B2 * | 4/2006 | Takenaka et al. | 310/64 |
| 7,032,695 B2 * | 4/2006 | Beihoff et al. | 180/65.1 |
| 7,112,045 B2 * | 9/2006 | Kimura et al. | 417/371 |
| 7,150,604 B2 * | 12/2006 | Girod et al. | 417/410.1 |
| 7,154,755 B2 * | 12/2006 | Araujo | 361/720 |
| 7,207,187 B2 * | 4/2007 | Funahashi et al. | 62/228.4 |
| 7,265,981 B2 * | 9/2007 | Lee | 361/707 |
| 7,273,357 B2 * | 9/2007 | Hattori et al. | 417/313 |
| 7,375,287 B2 * | 5/2008 | Rathmann | 174/260 |
| 7,417,861 B2 * | 8/2008 | Kikuchi et al. | 361/718 |
| 7,473,080 B2 * | 1/2009 | Kawada et al. | 417/423.14 |
| 7,525,224 B2 * | 4/2009 | Takenaka et al. | 310/54 |
| 7,561,429 B2 * | 7/2009 | Yahata et al. | 361/715 |
| 7,561,435 B2 * | 7/2009 | Kamoshida et al. | 361/752 |
| 2001/0014029 A1 * | 8/2001 | Suzuki et al. | 363/141 |
| 2002/0039532 A1 | 4/2002 | Saito et al. | |
| 2003/0200761 A1 | 10/2003 | Funahashi et al. | |
| 2004/0197213 A1 * | 10/2004 | Takemoto | 417/410.1 |
| 2007/0053157 A1 * | 3/2007 | Huang et al. | 361/688 |
| 2007/0115707 A1 * | 5/2007 | Koide | 363/146 |

FOREIGN PATENT DOCUMENTS

| | | | |
|---|---|---|---|
| JP | 2003153552 A * | 5/2003 | |
| JP | 3760887 | 11/2003 | |
| JP | 2004-190547 | 7/2004 | |
| JP | 2004-197688 | 7/2004 | |
| JP | 2005036773 A * | 2/2005 | |
| JP | 2006188085 A * | 7/2006 | |
| JP | 2006-233820 | 9/2006 | |

OTHER PUBLICATIONS

Machine Translation of JP2003153552A.*
Machine Translation of JP2006188085A.*
Partial European Search Report issued Oct. 8, 2009 in the corresponding European Patent Application No. 07102489.
Extended European Search Report issued Jan. 7, 2010 in connection with corresponding European Application No. 07 10 2 489.

* cited by examiner

INVERTER-INTEGRATED ELECTRIC COMPRESSOR WITH INVERTER STORAGE BOX ARRANGEMENT

BACKGROUND OF THE INVENTION

1. Field of the Invention

The present invention relates to an inverter-integrated electric compressor that is particularly suitable for use in an air-conditioner apparatus of a vehicle.

This application is based on Japanese Patent Applications Nos. 2006-315771 and 2006-315772, the contents of which are incorporated herein by reference.

2. Description of Related Art

Currently, the automobile industry is rapidly promoting the development and commercialization of electrically driven vehicles, such as hybrid vehicles, electric vehicles, and fuel-cell-powered vehicles, to improve energy efficiency.

These vehicles employ air-conditioner apparatuses that, unlike conventional air-conditioner apparatuses, are provided with electric compressors driven by electrically powered motors.

These electric compressors are encapsulated electric compressors having a compressor and an electric motor in a housing and convert direct-current power from the power supply into three-phase alternating-current power via an inverter apparatus. The three-phase alternating-current power is supplied to the electric motor so that the rotational speed in the compressor can be variably controlled according to the air-conditioning load.

For such inverter-driven electric compressors, there have been proposed many inverter-integrated electric compressors that integrate inverter apparatuses with housings thereof.

For example, Japanese Unexamined Patent Application, Publication No. 2004-190547 proposes an inverter-integrated electric compressor that includes an inverter assembly composed of a metal base plate, a power semiconductor module, a smoothing capacitor, a busbar assembly, and a printed substrate, in which an inverter apparatus is integrated with the electric compressor by securing the base plate of the inverter assembly on the circumferential top surface of the housing of the electric compressor.

In addition, Publication of Japanese Patent No. 3760887 proposes an inverter-integrated electric compressor that includes, on a flat base surface of the outer circumferential surface of a motor housing, six power MOS transistor modules (power semiconductor switching elements) constituting upper-arm switching elements and lower-arm switching elements for the three phases of a three-phase inverter such that these six power MOS transistor modules are arranged side by side in three columns in the motor shaft direction and in two rows in the radial direction to allow one set of the three power MOS transistor modules in the radial direction to serve as the upper-arm switching elements and the other set of the three power MOS transistor modules in the radial direction to serve as the lower-arm switching elements.

For such an inverter apparatus that is integrated with the outer circumference of the housing of an electric compressor for integration with the electric compressor, it is necessary to take measures to cool power semiconductor modules, which generate heat, such as Insulated Gate Bipolar Transistors (IGBTs), and to take measures to ensure the ability to withstand vibrations from the vehicle in which the electric compressor is mounted.

These heat-generating elements are typically cooled by using the above-described metal base plate (aluminum plate) serving as a heatsink and by drawing upon the endothermic effect of low-temperature refrigerant gas flowing in the housing of the electric compressor.

As far as vibration is concerned, in view of minimizing cost and weight, vibration resistance is increased by firmly securing a metal base plate made of an aluminum alloy to the housing with screws at a plurality of (normally four) locations, thereby increasing the natural frequency.

When mounted in a vehicle, such an inverter-integrated electric compressor is typically oriented such that the motor shaft direction is parallel to the front/back direction of the vehicle, and one side surface of the inverter-integrated electric compressor is bolted onto a bracket which is fixed, for example, on a side surface of the prime mover at three locations, two in the lower part and one in the upper part. For this reason, vertical vibration from the vehicle is applied to the inverter-integrated electric compressor as vibration around the motor shaft, which possibly causes the inverter apparatus to resonate with the vibration via the metal base plate.

Countermeasures against this resonance include increasing stiffness by using a thick metal base plate or increasing the number of fixing positions on the housing. Simply making the metal base plate thicker or increasing the number of bolts, however, is not desirable because doing so would adversely affect the capability to cool the heat-generating elements, the reduction in weight, and the ease of assembly. Thus, vibration of inverter apparatuses remains a problem which must be solved.

Furthermore, for the power MOS transistor modules in the inverter apparatus of the inverter-integrated electric compressor described in the above-described Publication of Japanese Patent No. 3760887, the surrounding wall of the motor housing is used as a heatsink, and heat generated by these power MOS transistor modules is released to refrigerant gas flowing in the motor housing. In this manner, a compact and lightweight inverter apparatus is realized, and the heat-dissipating resistance is reduced to achieve effective cooling of the inverter apparatus.

With the above-described layout of the power MOS transistor modules, however, it is not possible to uniformly cool the upper-arm U-V-W phase-switching elements and the lower-arm U-V-W phase-switching elements due to the manner in which the refrigerant gas flows in the motor housing. Due to this, the phase-switching elements are cooled differently from each other, which may lead to unstable operation of the inverter apparatus.

BRIEF SUMMARY OF THE INVENTION

The present invention was conceived in light of the above circumstances, and an object thereof is to provide an inverter-integrated electric compressor that can enhance the vibration resistance of an inverter apparatus integrated with the housing of the electric compressor while still maintaining the cooling performance, the low weight, and the ease of assembly of the inverter apparatus.

Another object of the present invention is to provide an inverter-integrated electric compressor that can achieve stable operation of an inverter apparatus by uniformly cooling phase-switching elements of power semiconductor switching elements constituting the inverter apparatus.

To achieve the above-described objects, an inverter-integrated electric compressor according to the present invention provides the following solutions.

Specifically, in an inverter-integrated electric compressor according to a first aspect of the present invention, an inverter storage box is provided on an outer circumference of a housing accommodating an electric compressor, and an inverter apparatus for converting direct-current power to three-phase alternating-current power and supplying power to an electric motor is integrated with the inverter storage box. The inverter apparatus includes a metal plate secured in the inverter storage box; a plurality of power semiconductor switching elements mounted on the metal plate; a power substrate mounted on the metal plate, the power substrate having thereon a power-related control circuit for operating the power semiconductor switching elements; and a busbar assembly having a plurality of busbars functioning as wiring of the inverter apparatus, each busbar being integrated with an insulator. The metal plate includes a protrusion extending in a width direction perpendicular to a motor shaft direction of the electric motor.

According to the first aspect of the present invention, the plurality of power semiconductor switching elements, the power substrate, the busbar assembly, and so forth constituting the inverter apparatus are mounted on the metal plate, which is secured in the inverter storage box of the housing. Furthermore, since the metal plate includes a protrusion extending in the width direction perpendicular to the motor shaft direction of the electric motor, the stiffness of the metal plate against vibration around the motor shaft can be increased and the vibration resistance can be enhanced. Therefore, the vibration resistance of the metal plate, and ultimately of the inverter apparatus, can be enhanced easily without having to make the metal plate thicker or increasing the number of fixing points. Furthermore, the cooling performance, reduction in weight, and the ease of assembly of the inverter apparatus can be ensured.

Furthermore, in the above-described inverter-integrated electric compressor according to the first aspect of the present invention, a plurality of the protrusions may be provided on the metal plate at predetermined intervals in the motor shaft direction.

With this structure, since the plurality of protrusions is provided at predetermined intervals in the motor shaft direction, the stiffness of the metal plate to limit vibrations around the motor shaft can be increased significantly. Therefore, the vibration resistance of the metal plate and the inverter apparatus can be further enhanced.

Furthermore, in any of the above-described inverter-integrated electric compressors according to the first aspect, the protrusions may be formed by bending both end portions of the metal plate in a direction perpendicular to the motor shaft direction.

With this structure, since the protrusions are formed by bending both end portions of the metal plate in the direction perpendicular to the motor shaft direction, the protrusions can be provided merely by additionally bending two portions of the metal plate, that is, without specially having to increase the number of processes or the amount of plate material. Therefore, the stiffness can be increased significantly and the vibration resistance of the inverter apparatus can be enhanced without increasing the manufacturing cost.

Furthermore, in any of the above-described inverter-integrated electric compressors according to the first aspect, the power substrate may be secured with screws to bosses provided at least three locations on the metal plate.

With this structure, since the power substrate is secured with screws to bosses provided at least three locations on the metal plate, the power substrate is firmly secured on the bosses integrally with the metal plate and the power substrate does not become loose due to vibration. Therefore, the stiffness of the inverter apparatus can be increased and the vibration resistance thereof can be enhanced.

Furthermore, in any of the above-described inverter-integrated electric compressors according to the first aspect, the bosses may be provided at least three locations by bending up part of the metal plate, and a bent section at least one of the locations may be bent in a direction parallel to the protrusions.

With this structure, since the bosses are provided at least three locations by bending up part of the metal plate and the bent section at least one of the locations is bent in a direction parallel to the protrusions, the bent section in a direction parallel to these protrusions, together with the protrusions, can be made to contribute to increased stiffness against vibration around the motor shaft of the metal plate. Therefore, this can also increase the stiffness against vibration around the motor shaft of the metal plate and enhance vibration resistance of the metal plate and the inverter apparatus.

Furthermore, in any of the above-described inverter-integrated electric compressors according to the first aspect, the busbar assembly may be secured on the power substrate and may be provided between screw positions for securing the power substrate on the metal plate.

With this structure, since the busbar assembly is positioned between screw positions for securing the power substrate on the metal plate, the busbar assembly serves as a beam which increases the stiffness of the power substrate in an integrated state. As a result, the stiffness of the inverter apparatus can be increased and the vibration resistance thereof can be further enhanced.

Furthermore, in any of the above-described inverter-integrated electric compressors according to the first aspect, the busbar assembly may be L-shaped and may be secured along two adjacent sides of the power substrate.

With this structure, since the L-shaped busbar assembly is secured along two adjacent sides of the power substrate, not only can a plurality of busbars be integrated as a single component, but also the resistance to torsion of the power substrate can be increased. Therefore, the ease of assembly and vibration resistance of the inverter apparatus can be enhanced.

Furthermore, in any of the above-described inverter-integrated electric compressors according to the first aspect of the present invention, the plurality of power semiconductor switching elements may be arranged such that a plurality of terminals extending from a side surface of each element is arranged in a line, each of the plurality of terminals being bent upwardly in an L shape.

With this structure, since each of the plurality of terminals, bent upwardly in an L shape, extends from side surfaces of the power semiconductor switching elements arranged in a line, stress on the terminals due to vibration in the bending direction can be distributed uniformly. Therefore, the vibration resistance of the power semiconductor switching elements, and ultimately of the inverter apparatus, can be further enhanced.

Furthermore, in any of the above-described inverter-integrated electric compressors according to the first aspect, the plurality of terminals extending from each of the elements may be arranged in a line in a direction parallel to the protrusions.

With this structure, since the plurality of terminals extending from each of the elements is arranged in a line in a direction parallel to the protrusions, the terminals, which are easily damaged by vibrations in the bending direction, can be arranged in a direction in which stiffness is increased by the protrusions. Therefore, the vibration resistance of the power semiconductor switching elements, and ultimately of the inverter apparatus, can be further enhanced.

Furthermore, in any of the above-described inverter-integrated electric compressors according to the first aspect of the present invention, the metal plate may be secured with screws on a mounting surface of the inverter storage box at least four corners.

With this structure, since the metal plate is secured with screws on the mounting space of the inverter storage box at least four corners, the inverter apparatus can be firmly secured with screws on the mounting surface of the inverter storage box of the housing at four corners via the metal plate whose stiffness against vibration around the motor shaft has been increased by the protrusions. Therefore, the vibration resistance of the inverter apparatus can be enhanced while still ensuring the cooling performance, low weight, and the ease of assembly of the inverter apparatus.

Furthermore, in any of the above-described inverter-integrated electric compressors according to the first aspect, the metal plate may be secured with a screw on the mounting surface of the inverter storage box at least at a substantially central position thereof in addition to the four corners.

With this structure, since the metal plate is secured with a screw on the mounting surface of the inverter storage box at least at a substantially central position thereof in addition to the four corners, the stiffness of the metal plate can be enhanced efficiently. By doing so, the stress applied to the terminals of the power semiconductor switching elements mounted on the metal plate is reduced and the vibration resistance of the inverter apparatus can be further enhanced.

Furthermore, in any of the above-described inverter-integrated electric compressors according to the first aspect of the present invention, the metal plate may be made of an aluminum alloy.

With this structure, since the metal plate is made of an aluminum alloy, a high level of cooling performance and a low weight of the inverter apparatus can be achieved by the superior heat transfer characteristics and the lightness of the aluminum alloy.

In an inverter-integrated electric compressor according to a second aspect of the present invention, an inverter storage box is provided on an outer circumference of a housing accommodating an electric compressor, and an inverter apparatus for converting direct-current power to three-phase alternating-current power and supplying power to an electric motor is integrated with the inverter storage box. The inverter apparatus includes a plurality of power semiconductor switching elements constituting upper-arm switching elements and lower-arm switching elements for phases of a three-phase inverter. The power semiconductor switching elements are arranged such that the members of a pair, composed of the upper-arm switching element and the lower-arm switching element for each phase, are arranged in two columns in a motor shaft direction of the electric motor. The upper-arm switching element for each phase in one of the columns and the lower-arm switching element for the same phase in the other of the columns are arranged side by side in a direction perpendicular to the motor shaft direction.

According to the second aspect of the present invention, of the plurality of power semiconductor switching elements constituting the inverter apparatus, the members of a pair, composed of the upper-arm switching element and the lower-arm switching element for each phase, are arranged in two columns in the motor shaft direction of the electric motor, and the upper-arm switching element for each phase in one of the columns and the lower-arm switching element for the same phase in the other of the columns are arranged side by side in a direction perpendicular to the motor shaft direction. Therefore, the upper-arm switching element and the lower-arm switching element for each phase can be cooled uniformly. As a result, the switching elements for each phase are prevented from being cooled differently from each other, which allows stable operation of the power semiconductor switching elements.

Furthermore, in the above-described inverter-integrated electric compressor according to the second aspect, the lower-arm switching elements may be disposed adjacent to a side where refrigerant gas flowing in the housing is drawn.

With this structure, since the lower-arm switching elements are cooled by relatively low temperature refrigerant gas, adjacent to the suction side, that flows in the housing, the lower-arm switching elements can be cooled more efficiently. As a result, on the power substrate, the positive pattern corresponding to the upper arm side where noise occurs easily is positioned near the motor terminal, which can be enclosed by the negative pattern corresponding to the stable lower-arm side. This structure can reduce emission of switching noise.

Furthermore, in any of the above-described inverter-integrated electric compressors according to the second aspect, the power semiconductor switching elements may be mounted, either directly or via a heat-dissipating plate, on a heat-dissipating surface formed on the inverter storage box.

With this structure, since the power semiconductor switching elements are mounted, either directly or via a heat-dissipating plate, on a heat-dissipating surface formed on the inverter storage box, heat generated from the power semiconductor switching elements can be efficiently released from the heat-dissipating surface via the housing wall to the low-temperature refrigerant gas flowing in the housing. Therefore, the power semiconductor switching elements are cooled more efficiently, and hence, the heat load of the power semiconductor switching elements can be reduced.

Furthermore, in any of the above-described inverter-integrated electric compressors according to the second aspect, the heat-dissipating surface may be finished by a cutting processing.

With this structure, since the heat-dissipating surface is finished by a cutting processing, the heat transfer coefficient on the heat-dissipating surface can be enhanced. By doing so, the efficiency of heat dissipation from the power semiconductor switching elements to the refrigerant gas is increased. Therefore, the effect of cooling the power semiconductor switching elements can be enhanced to be as rapid as possible.

Furthermore, in any of the above-described inverter-integrated electric compressors according to the second aspect, the heat-dissipating surface may be divided into a heat-dissipating surface for the upper-arm switching elements and a heat-dissipating surface for the lower-arm switching elements, and an area therebetween may be a non-cutting portion.

With this structure, since the heat-dissipating surface finished by cutting is divided into two surfaces and the area therebetween is a non-cutting portion in the housing which is typically a die-casting, the area to be processed by cutting can be limited to be as small as possible. By doing so, the danger of exposing casting defects (shrinkage cavity) on the cutting process surface in the housing which was die-cast, can be reduced. This prevents refrigerant gas from leaking through such casting defects.

According to the present invention, the stiffness of the metal plate against vibration around the motor shaft can be increased (vibration resistance can be enhanced) by providing the metal plate with a protrusion extending in the width direction perpendicular to the motor shaft direction of the electric motor. Therefore, the vibration resistance of the metal plate, and eventually of the inverter apparatus, can be enhanced easily without having to make the metal plate thicker or increasing the number of fixing locations. Furthermore, the cooling performance, low weight, and the ease of assembly of the inverter apparatus can be ensured.

In addition, according to the present invention, of the plurality of power semiconductor switching elements constituting the inverter apparatus, the upper-arm switching element and the lower-arm switching element for each phase can be cooled uniformly by refrigerant gas flowing in the housing, and therefore, the phase-switching elements are prevented from being cooled differently from each other. This ensures stable operation of the power semiconductor switching elements.

DETAILED DESCRIPTION OF THE INVENTION

An embodiment according to the present invention will now be described with reference to FIGS. 1 to 9.

Figure 1:
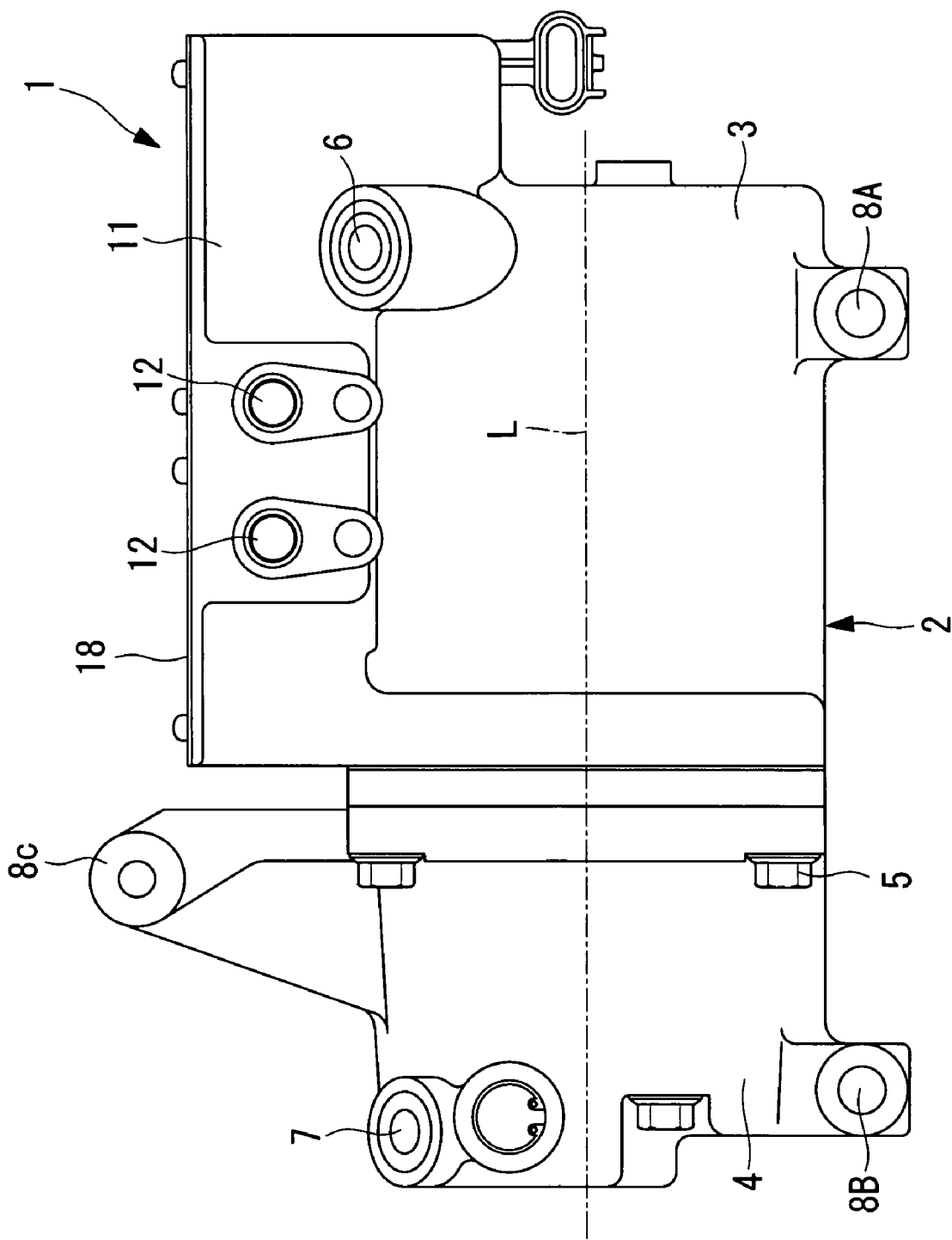
FIG. 1 is an external side view of an inverter-integrated electric compressor according to one embodiment of the present invention.

FIG. 1 is an external side view of an inverter-integrated electric compressor 1 according to an embodiment of the present invention. The inverter-integrated electric compressor 1 includes a housing 2 constituting an outer shell thereof. The housing 2 is constructed by integrally securing a motor housing 3 for accommodating an electric motor (not shown in the figure) and a compressor housing 4 for accommodating a compressor (not shown in the figure) by tightening bolts 5. The motor housing 3 and compressor housing 4 are formed by aluminum die-casting.

The electric motor and the compressor (not shown in the figure) accommodated in the motor housing 3 and the compressor housing 4, respectively, are linked via a motor shaft, and the compressor is driven as a result of the electric motor being rotated. A suction port 6 is provided at the rear end (on the right side of FIG. 1) of the motor housing 3 so that low-pressure refrigerant gas drawn from this suction port 6 into the motor housing 3 flows around the electric motor and goes into the compressor, where the low-pressure refrigerant gas is compressed. As a result of being compressed by the compressor, high-temperature and high-pressure refrigerant gas is discharged into the compressor housing 4 and is expelled to the outside via a discharge port 7 provided at the front end (on the left side of FIG. 1) of the compressor housing 4.

Figure 2:
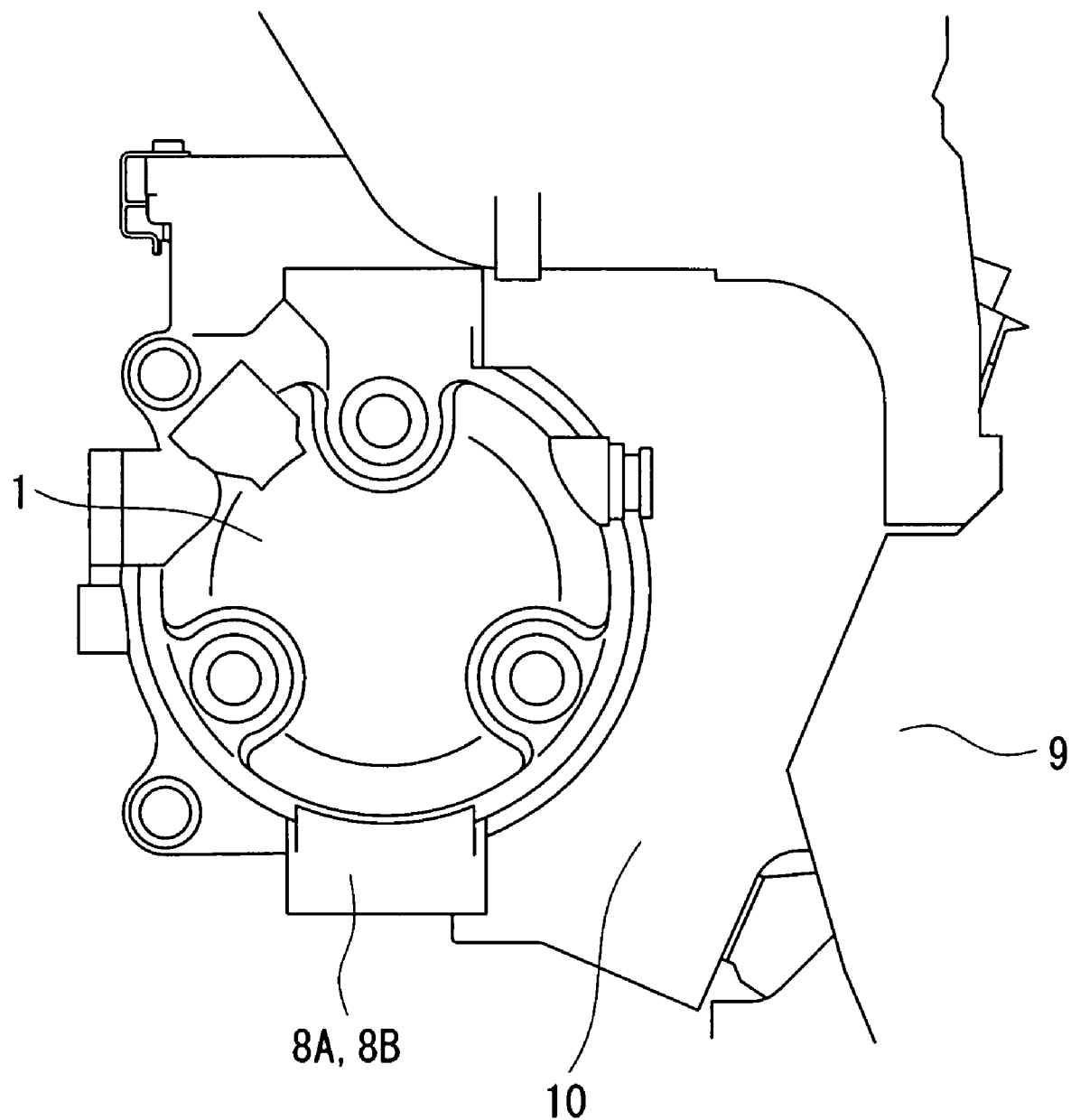
FIG. 2 is a front view of the inverter-integrated electric compressor shown in FIG. 1 mounted in a vehicle.

The housing 2 has three mounting legs 8A, 8B, and 8C; one leg is at a lower part of the rear end (on the right side of FIG. 1) of the motor housing 3, one leg is at a lower part of the front end (on the left side of FIG. 1) of the compressor housing 4, and one leg is at an upper part of the compressor housing 4. Referring to FIG. 2, the inverter-integrated electric compressor 1 is secured to a vehicle via the mounting legs 8A, 8B, and 8C by affixing it with retainers, such as bolts, to a cantilever bracket 10 fixed on, for example, a side wall of a prime mover 9 for driving the vehicle. As described above, the inverter-integrated electric compressor 1 is typically oriented such that a motor shaft direction L is parallel to the front/back direction of the vehicle by bringing one side surface thereof into contact with the cantilever bracket 10 and is supported at three upper and lower locations on the one side.

Figure 3:
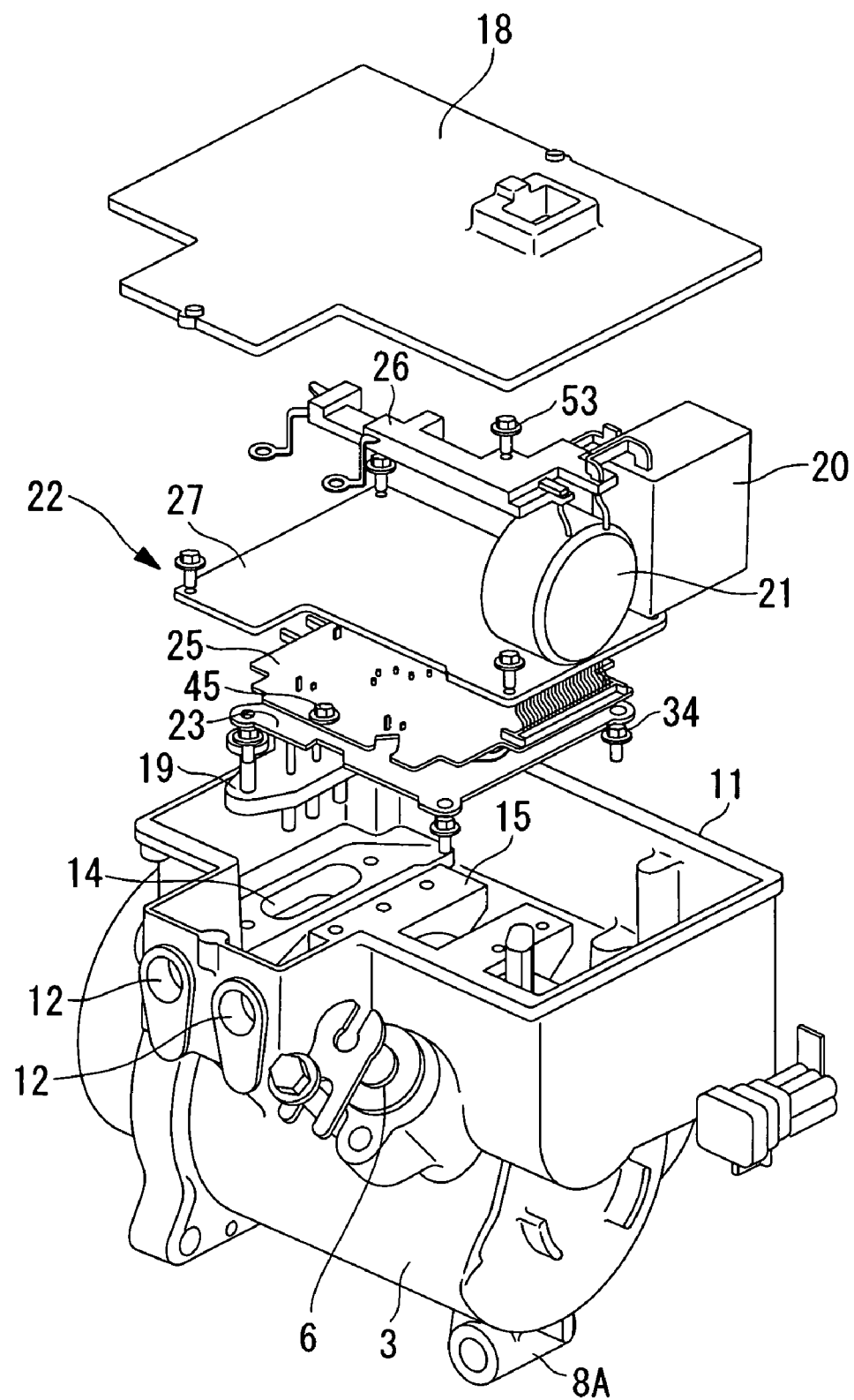
FIG. 3 is an exploded perspective view from a motor housing of the inverter-integrated electric compressor shown in FIG. 1.
Figure 4:
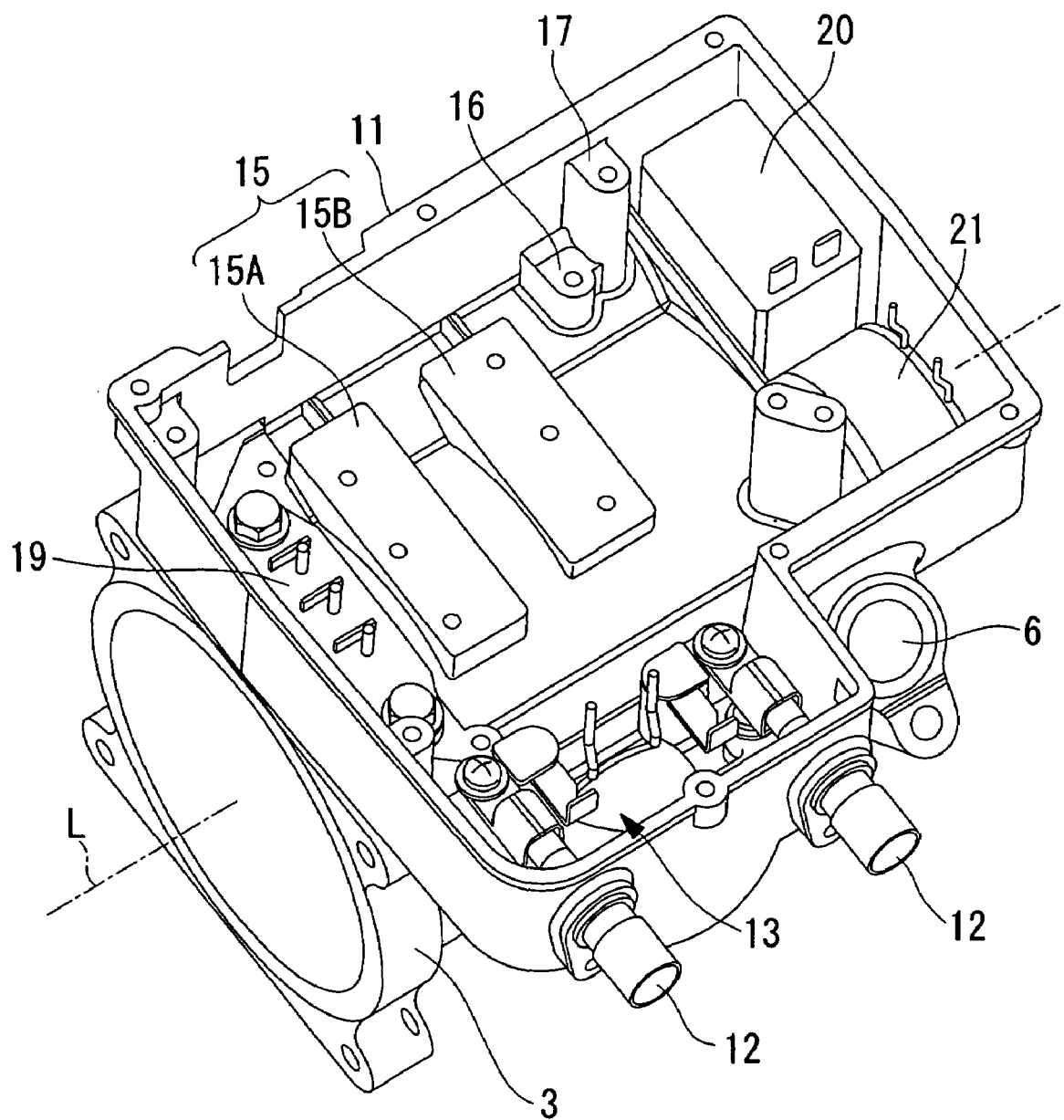
FIG. 4 is a top perspective view of a motor housing of the inverter-integrated electric compressor shown in FIG. 1.

Furthermore, a box-shaped inverter storage box 11 is integrally formed at an upper part of the outer circumferential surface of the motor housing 3. Referring to FIGS. 3 and 4, the inverter storage box 11 is shaped like a box having a top which is open and is composed of surrounding walls of a certain height. Two power cable outlets 12 are provided on a side surface of the inverter storage box 11. A direct-current-power P-N terminal 13 to which a power cable is connected, a motor-terminal mounting hole 14, a metal-plate heat-dissipating surface 15, metal-plate mounting bosses 16, CPU-substrate mounting bosses 17, and so forth are provided in the inverter storage box 11. Furthermore, the inverter storage box 11 accommodates a motor terminal 19 mounted in the motor-terminal mounting hole 14, a head capacitor 20, an inductor 21, an inverter apparatus 22, and so forth. The top surface of the inverter storage box 11 is covered with a lid 18 that is secured with screws.

The heat-dissipating surface 15 serves to release heat generated by six power semiconductor switching elements 24 (which will be described later) via the housing wall to low-temperature refrigerant gas flowing in the motor housing 3. This heat-dissipating surface 15 includes two heat-dissipating surfaces 15A and 15B: one corresponding to upper-arm switching elements 24A and the other corresponding to lower-arm switching elements 24B for the three phases (UVW) of a three-phase inverter. These two heat-dissipating surfaces 15A and 15B are finished by cutting processing. In contrast, most parts of the inner surface of the inverter storage box 11, including the part between the above-described two heat-dissipating surfaces 15A and 15B, remain as a die-casting molded surface.

Figure 5:
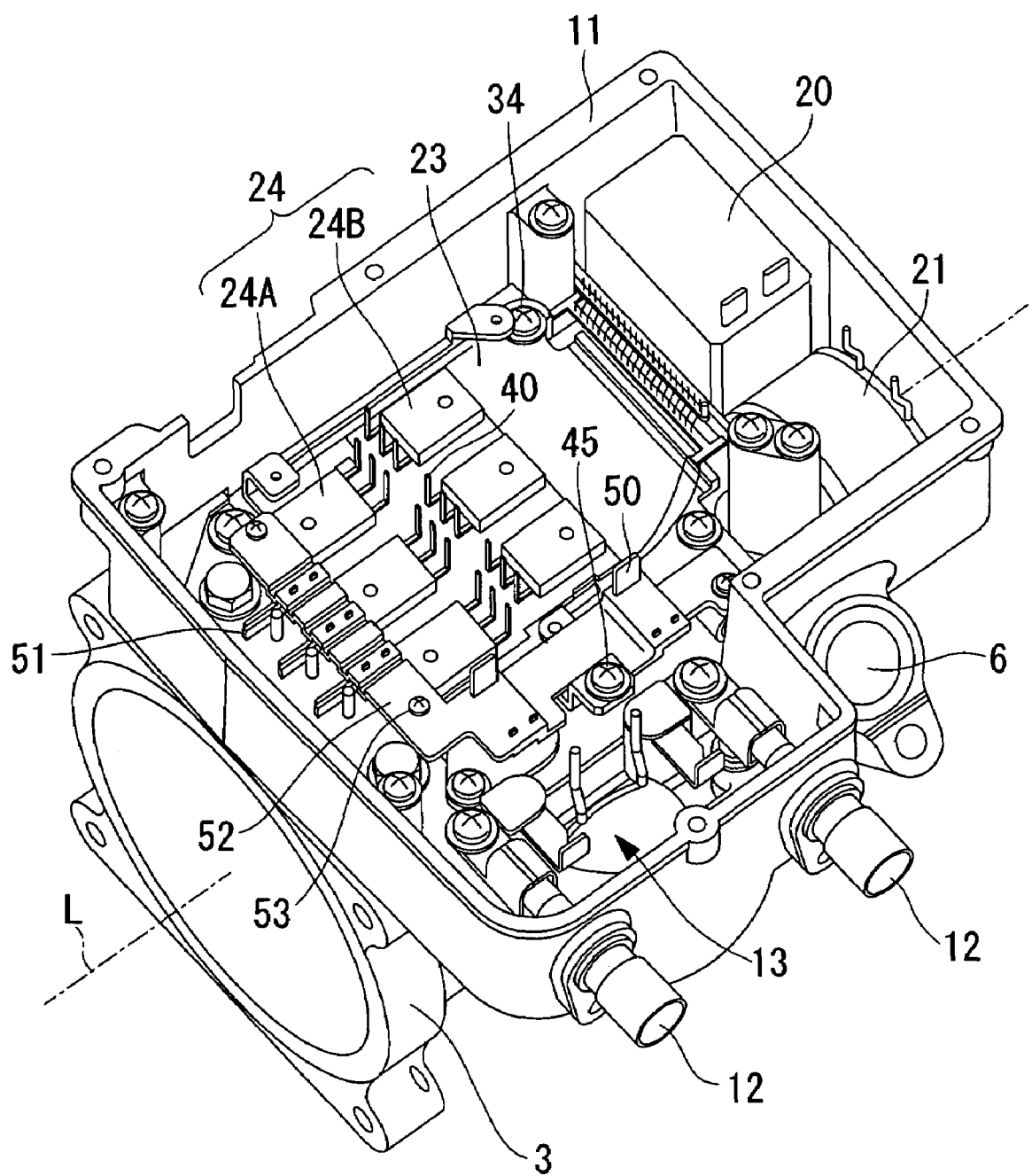
FIG. 5 is a top perspective view of a motor housing that includes an inverter apparatus of the inverter-integrated electric compressor shown in FIG. 1.

Referring to FIGS. 3 and 5, the inverter apparatus 22 includes a metal plate 23 made of an aluminum alloy, functioning as a heatsink, that is fixed on the bosses 16 at four corners such that it is in contact with the heat-dissipating surface 15 of the inverter storage box 11; six power semiconductor switching elements (hereinafter, referred to as Insulated Gate Bipolar Transistors, or "IGBTs") 24 (refer to FIGS. 5, 6, and 8) constituting the upper-arm switching elements and the lower-arm switching elements for the phases of the three-phase inverter mounted on this metal plate 23; a power substrate 25 on which a power-related control circuit for operating the IGBTs 24 is mounted and which is secured to bosses on the metal plate 23; a busbar assembly 26 integrally formed by insert-molding a plurality of busbars, functioning as wiring of the inverter apparatus 20, with resin serving as an insulator; and a CPU substrate 27 on which a circuit having elements which operate at low voltage, such as a CPU, is mounted and which is secured to the bosses 17 at the four corners thereof.

Figure 7:
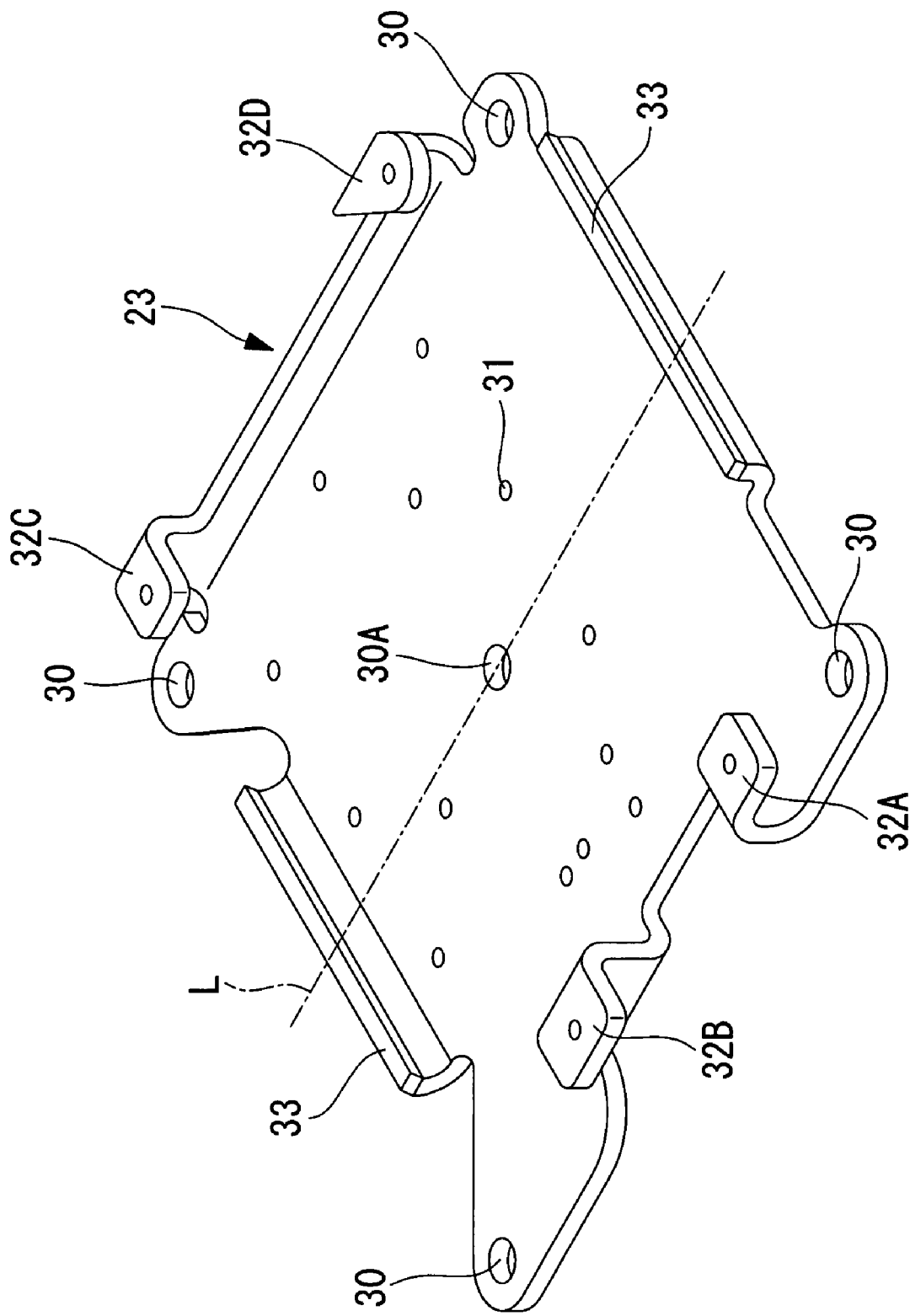
FIG. 7 is a perspective view of a metal plate constituting an inverter apparatus of the inverter-integrated electric compressor shown in FIG. 1.

Referring to FIGS. 5 and 7, the metal plate 23 made of an aluminum alloy is a rectangular pressed plate which has threaded holes 30 formed at the four corners thereof for securing the metal plate 23 to the bosses 16 of the inverter storage box 9 with screws 34. This metal plate 23 is provided with a plurality of holes 31 for mounting the six IGBTs 24 and a plurality of bosses 32A to 32D for mounting the power substrate 25. In order to increase the stiffness of the metal plate 23 in the direction perpendicular to the motor shaft direction L, the metal plate 23 is further provided with ribs (protrusions) 33 that are formed by bending the metal plate 23 upwardly at both end portions thereof in the motor shaft direction L so as to extend in the width direction of the metal plate 23.

In addition to the threaded holes 30 at the four corners, the metal plate 23 may also be provided with a threaded hole 30A at a substantially central location thereof.

In order to firmly secure the power substrate 25, the above-described bosses for securing the power substrate 25 are formed at least three locations (four locations corresponding to the bosses 32A to 32D, respectively, in this embodiment) by bending up part of the metal plate 23. The bent section of at least one boss (32A in this example) of the bosses 32A to 32D is bent in the direction perpendicular to the motor shaft direction L, that is, in the direction parallel to the ribs (protrusions) 33.

The ribs (protrusions) 33 are formed not only by bending both end portions of the metal plate 23. A plurality of (at least two) ribs (protrusions) 33 may be provided, spaced at predetermined intervals, in parallel at a substantially central position of the plate.

Figure 6:
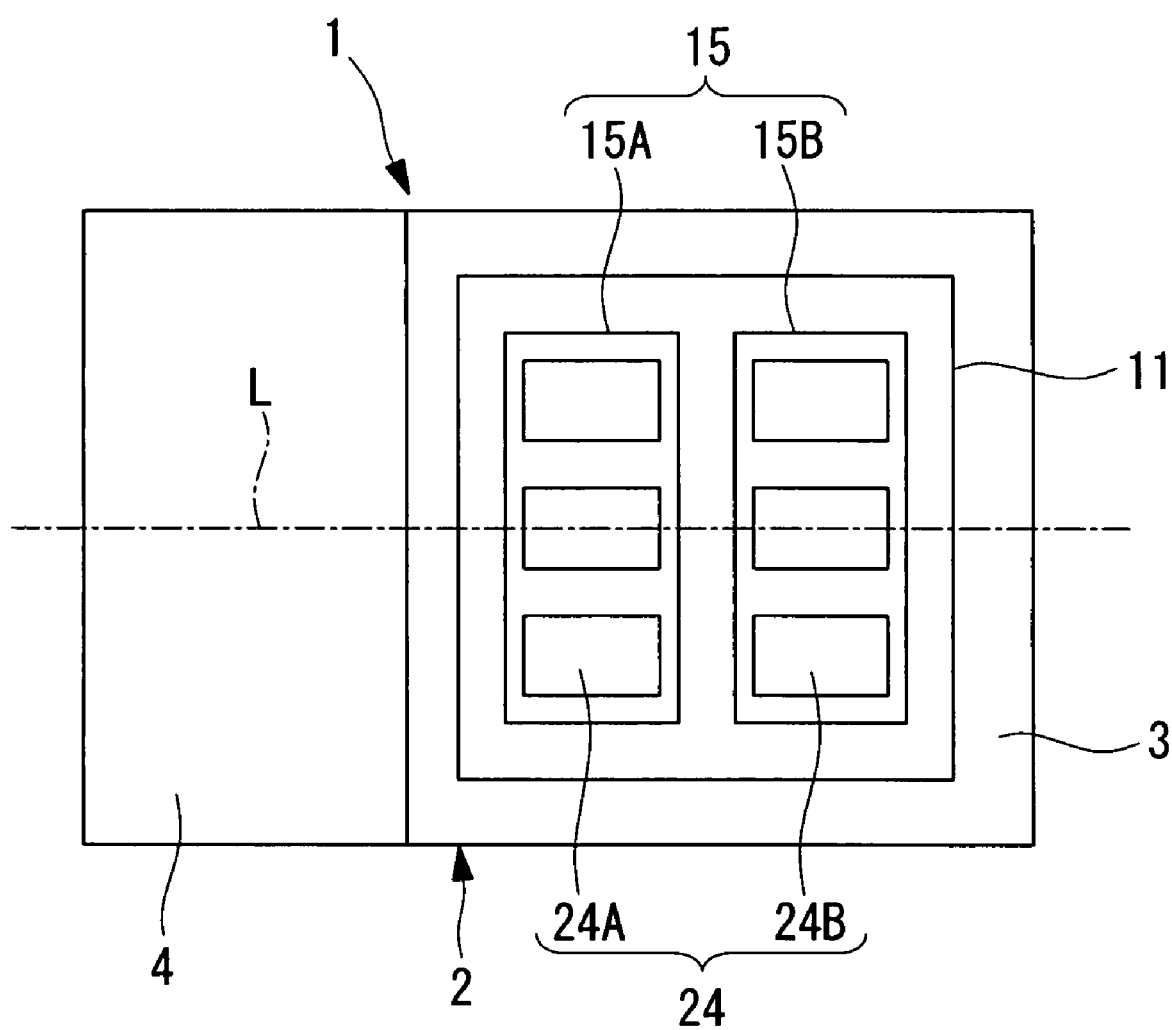
FIG. 6 is a schematic plan view of IGBTs that are arranged in an inverter apparatus of the inverter-integrated electric compressor shown in FIG. 1.

Referring to FIGS. 5 and 6, each of the six IGBTs 24 is formed in a box by resin molding and has a total of three terminals 40 arranged in a line, two main electrode terminals and one control electrode terminal being bent upwardly in an L shape, that extend from one side surface of the IGBT outwards. These six IGBTs 24 include three IGBTs 24A corresponding to the upper-arm three phases (UVW) and three IGBTs 24B corresponding to the lower-arm three phases (UVW). The IGBTs 24A are arranged side by side in the direction perpendicular to the motor shaft direction L, and the IGBTs 24B are also arranged side by side in the direction perpendicular to the motor shaft direction L such that the terminals 40 of the IGBTs 24A face the terminals 40 of the IGBTs 24B.

More specifically, the six IGBTs 24 are arranged in two columns in the motor shaft direction L and in three rows in the direction perpendicular to the motor shaft direction L. In other words, each pair composed of an upper-arm IGBT 24A in one column and the adjacent lower-arm IGBT 24B in the other column corresponds to one phase. In this layout, the six IGBTs 24 are secured on the metal plate 23 via an insulating sheet (not shown in the figure) with retainers such as screws.

The above-described three upper-arm IGBTs 24A are secured on the metal plate 23 so as to correspond to the heat-dissipating surface 15A, and the three lower-arm IGBTs 24B are secured on the metal plate 23 so as to correspond to the heat-dissipating surface 15B. By doing so, the lower-arm IGBTs 24B are positioned upstream of the refrigerant gas drawn from the suction port 6.

Figure 8:
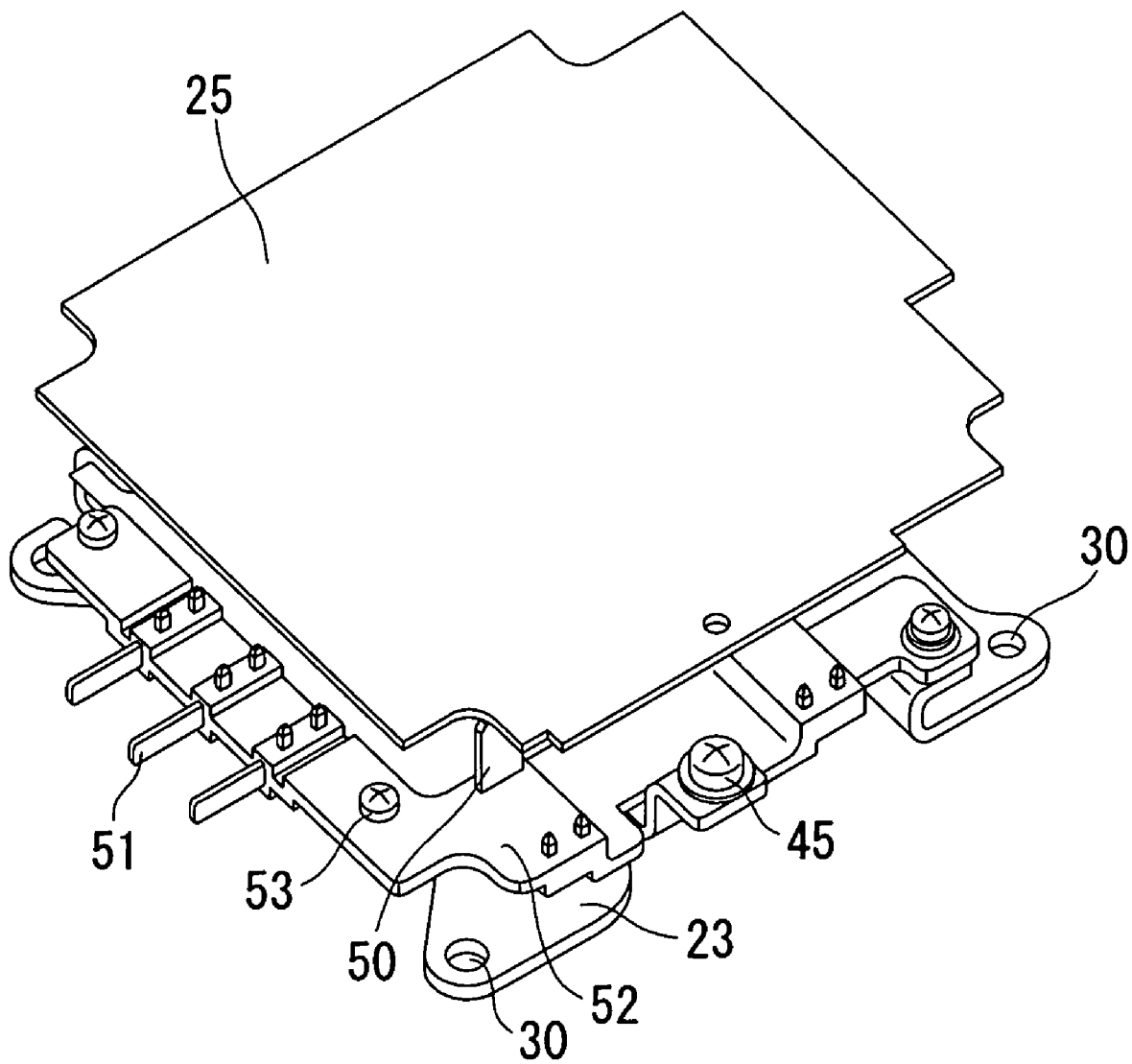
FIG. 8 is a perspective view of a power substrate separated from an inverter apparatus of the inverter-integrated electric compressor shown in FIG. 1.
Figure 9:
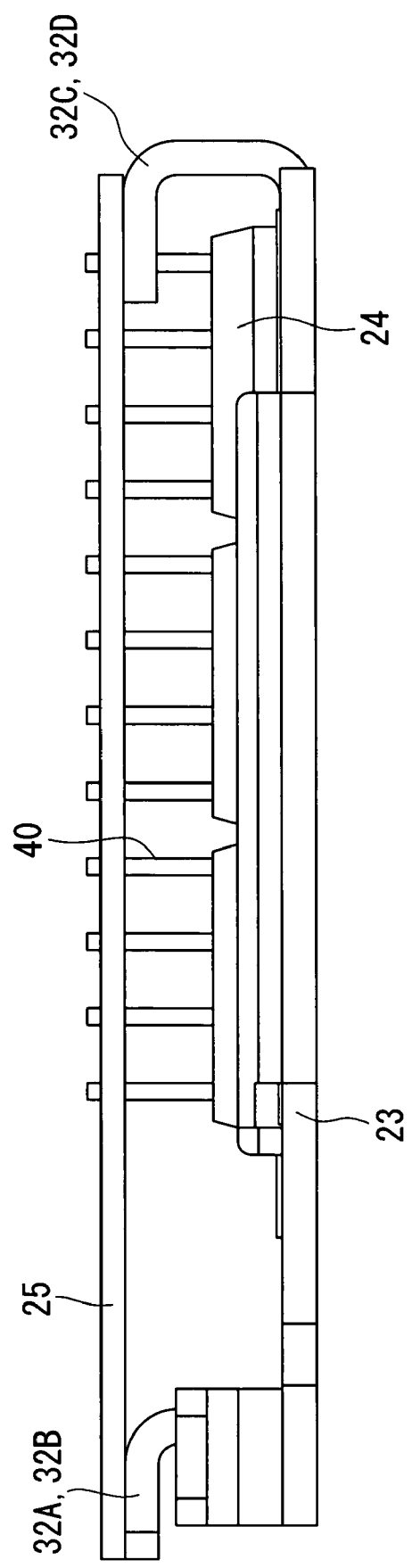
FIG. 9 is a side view taken in a direction perpendicular to the motor shaft of an inverter apparatus of the inverter-integrated electric compressor shown in FIG. 1.

Referring to FIGS. 3, 8, and 9, the power substrate 25 having the power-related control circuit includes connection holes to be engaged with the eighteen terminals 40 of the six IGBTs 24. The terminals 40 are fit in these connection holes and are soldered to a surrounding conductive pattern. The circuit on the power substrate 25 has a function for intermittently controlling the IGBTs 24 based on an external command to supply power to the electric motor, a function for externally transmitting a drive state of the electric motor, and other functions. This power substrate 25 is secured via screws 45 to the four bosses 32A to 32D on the metal plate 23 to be integral with the metal plate 23.

Referring to FIGS. 5 and 8, the busbar assembly 26 is formed as a single component by integrating through resin-insert molding a plurality of busbars, such as a P-N busbar 50 connecting the IGBTs 24 to the direct-current-power P-N terminal 13 and a U-V-W busbar 51 connecting the IGBTs 24 to the motor terminal 19. Inserted resin 52 of the busbar assembly 26 exhibits excellent electrical insulation between the busbars, even though only a small space is provided between the busbars. This busbar assembly 26 is formed in an L shape so as to face the direct-current-power P-N terminal 13 and the motor terminal 19 and is integrally secured on the power substrate 25 with a screw 53 along two adjacent sides of the power substrate 25. In addition, the busbar assembly 26 is so designed that when the power substrate 25 is secured with screws on the metal plate 23, the busbar assembly 26 is positioned between those screws.

As described above, the inverter apparatus 22 includes the six IGBTs 24, the power substrate 25, and the busbar assembly 26 on the metal plate 23 and is accommodated in the inverter storage box 11 of the motor housing 3 such that the bottom surface of the metal plate 23 is in contact with the heat-dissipating surfaces 15A and 15B. Furthermore, the CPU substrate 27 constituting the inverter apparatus 22 is secured with screws to the CPU-substrate mounting bosses 17, and the lid 18 is placed on the top of the inverter apparatus 22.

According to the above-described embodiment, the following advantages are provided.

The inverter apparatus 22 is accommodated in the inverter storage box 11 of the motor housing 3 and is integral with the electric compressor 1. This inverter apparatus 22 includes the metal plate 23 made of an aluminum alloy, the bottom surface of the metal plate 23 is in contact with the heat-dissipating surface 15 of the inverter storage box 11, and power-related heat-generating elements, such as the IGBTs 24, are mounted on the metal plate 23. Therefore, the metal plate 23 made of an aluminum alloy is cooled via the motor housing 3 by low-temperature and low-pressure refrigerant gas that is drawn from the suction port 6 into the motor housing 3 and flows around the electric motor. By doing this, the metal plate 23 serves as a heatsink to dissipate heat generated by components such as the IGBTs 24, and therefore, heat-generating elements such as the IGBTs 24 can be cooled.

Therefore, heat-generating components (elements) that constitute the inverter apparatus 22 and that need to be cooled can be cooled reliably by low-temperature refrigerant gas. This ensures the cooling function of the inverter apparatus 22.

Of the six IGBTs 24 (power semiconductor switching elements) constituting the three-phase inverter apparatus 22, the three IGBTs 24A corresponding to the upper-arm three phases (UVW) are arranged side by side in the direction perpendicular to the motor shaft direction L, and the three IGBTs 24B corresponding to the lower-arm three phases (UVW) are also arranged side by side in the direction perpendicular to the motor shaft direction L such that the terminals 40 of the IGBTs 24A face the terminals 40 of the IGBTs 24B. In this layout, the six IGBTs 24 are secured on the metal plate 23 via screws. Heat generated by these IGBTs 24A and IGBTs 24B is transmitted to the heat-dissipating surfaces 15A and 15B of the inverter storage box 11 via the metal plate 23 and is then released through the housing wall of the motor housing 3 to low-temperature and low-pressure refrigerant gas flowing in the motor housing 3. As a result, the IGBTs 24, which are elements that produce heat, are forcibly cooled.

Therefore, with the metal plate 23 and the motor housing 3 serving as heatsinks, the entire inverter apparatus 22 including the IGBTs 24 can be efficiently cooled by the low-temperature and low-pressure refrigerant gas. This can reduce the heat load of the inverter apparatus 22. Furthermore, since the six IGBTs 24 are arranged as described above, the upper-arm IGBTs 24A and the lower-arm IGBTs 24B for the U-V-W phases can be cooled uniformly. As a result, the members of the pair of IGBTs 24 for each phase are prevented from being cooled differently from each other, which yields stable operation of the IGBTs (power semiconductor switching elements) 24.

Furthermore, since the lower-arm IGBTs 24B are disposed closer to the suction port 6 (i.e., upstream along the flow of refrigerant gas) and is cooled by lower-temperature refrigerant gas, the lower-arm IGBTs 24B are cooled more efficiently. As a result, on the power substrate 25, the positive pattern corresponding to the upper arm side where noise occurs easily is positioned near the motor terminal 19, which can be enclosed by the negative pattern corresponding to the stable lower-arm side. This structure can reduce emission of switching noise.

In addition, since the IGBTs 24, which are heat-generating elements, are mounted on the metal plate 23 of aluminum alloy functioning as a heatsink and this metal plate 23 is in contact with the heat-dissipating surfaces 15A and 15B formed in the inverter storage box 11, heat generated from the IGBTs 24 can be efficiently released from the heat-dissipating surfaces 15A and 15B via the housing wall of the motor housing 3 to low-temperature refrigerant gas flowing in the motor housing 3. Therefore, the IGBTs (power semiconductor switching elements) 24 are cooled more efficiently, and hence, the heat load of the IGBTs 24 can be reduced.

In particular, since the heat-dissipating surface 15 includes the two heat-dissipating surfaces 15A and 15B corresponding to the upper-arm IGBTs 24A and the lower-arm IGBTs 24B, respectively, and the surfaces 15A and 15B are finished by cutting processing, the heat transfer coefficient on the heat-dissipating surfaces 15A and 15B can be enhanced. By doing this, the efficiency of heat dissipation from the IGBTs 24 to the refrigerant gas is increased so that the effect of cooling the IGBTs 24 can be enhanced to be as rapid as possible.

Furthermore, the area between the two heat-dissipating surfaces 15A and 15B finished by cutting is not processed by cutting, i.e., it remains as a molded surface formed at the time of die-casting. Leaving as large a molded surface as possible by limiting the part that is subjected to cutting processing only to the heat-dissipating surfaces 15A and 15B, as described above, reduces the danger of exposing casting defects (shrinkage cavity) on the cutting processing surface in the housing which was die-cast. This prevents refrigerant gas from leaking through such casting defects.

Vibration in the vehicle is transmitted to the inverter-integrated electric compressor 1 through the bracket 10. This vibration is also transmitted to the inverter apparatus 22 accommodated in the inverter storage box 11 of the motor housing 3 and is applied to the inverter apparatus 22 as an exciting force. In particular, vibration in the up and down direction of the vehicle may lead to vibration around the motor shaft of the electric compressor 1 due to the structure for mounting the inverter-integrated electric compressor 1 to the vehicle, and this vibration may be further transmitted to the inverter-integrated electric compressor 1, that is, the inverter apparatus 22, thus causing the inverter apparatus 22 to resonate.

As described above, however, the inverter apparatus 22 is disposed on the metal plate 23 made of an aluminum alloy, and this metal plate 23 includes the ribs (protrusions) 33 that are formed by bending the metal plate 23 upwardly at both the end portions thereof in the motor shaft direction L so as to extend in the width direction of the metal plate 23. As a result, the metal plate 23 has significantly increased stiffness against vibration around the motor shaft, and therefore, the natural frequency is made higher. This can reduce the above-described resonation of the inverter apparatus 22.

Therefore, the vibration resistance of the metal plate 23, and ultimately of the inverter apparatus 22, can be enhanced without having to make the metal plate 23 thicker or increasing the number of fixing locations. In addition, since the metal plate 23 is in contact with the heat-dissipating surface 15 of the inverter storage box 11 and is secured with screws at least four corners, the inverter apparatus 22 can be firmly secured with screws to the inverter storage box 11 of the motor housing 3 at four corners via the metal plate 23 whose stiffness against vibration around the motor shaft is increased by the ribs (protrusions) 33. Therefore, the vibration resistance of the entire inverter apparatus 22 can be enhanced by increasing the stiffness of the entire inverter apparatus 22 without degrading the cooling performance, reduction in weight, or the ease of assembly of the inverter apparatus 22.

Furthermore, since the metal plate 23 is made of an aluminum alloy, high cooling performance and low weight of the inverter apparatus 22 can be achieved by the superior heat transfer characteristics and lightness of the aluminum alloy.

In addition, since the ribs (protrusions) 33 are formed by bending upwardly both end portions of the metal plate 23, the ribs (protrusions) 33 for increasing the stiffness of the base plate 23 can be provided without having to particularly increase the number of processes or the amount of plate material. Therefore, the stiffness in the overall width direction perpendicular to the motor shaft direction L of the metal plate 23 can be increased without increasing the manufacturing cost.

Furthermore, the power substrate 25 mounted on the metal plate 23 is also firmly secured on the bosses 32A to 32D of the metal plate 23 at least three locations (four locations in this embodiment) to be integral with the metal plate 23. By doing so, the stiffness to counter vibration of the entire inverter apparatus 22 is increased to enhance the vibration resistance. In particular, since the bent section of at least one boss (32A in this example) of the bosses 32A to 32D for securing the power substrate 25 is bent in the direction perpendicular to the motor shaft direction L, that is, in the direction parallel to the ribs (protrusions) 33, this bent section can contribute to increased stiffness against vibration around the motor shaft, thereby further increasing the vibration resistance of the inverter apparatus 22.

Furthermore, the L-shaped busbar assembly 26 that is insert-molded with an insulator (resin material) is secured between two adjacent sides of the power substrate 25 to be integral with the power substrate 25. Since this busbar assembly 26 is disposed between members of a plurality of screws 45 for securing the power substrate 25 on the metal plate 23, the busbar assembly 26 serves as a beam. This also increases the mounting force and the torsion resistance of the power substrate 25 and thereby enhances the vibration resistance of the inverter apparatus 22. Since the busbar assembly 26 is integrated as a single component formed by integrating a plurality of busbars to serve as wiring of the inverter apparatus 22, the ease of assembly of the inverter apparatus 22 can be enhanced.

Furthermore, the six IGBTs 24 are arranged in two columns, one composed of the three upper-arm IGBTs 24A and the other composed of the three lower-arm IGBTs 24B, in the direction perpendicular to the motor shaft direction L such that the terminals 40 bent upwardly and extending from a side of the IGBTs 24A face the terminals 40 bent upwardly and extending from a side of the IGBTs 24B, that is, the terminals 40 of the IGBTs 24A and the terminals 40 of the IGBTs 40B are arranged in a line in the direction perpendicular to the motor shaft direction L. Therefore, not only can the stress applied to the terminals 40 by vibration in the bending direction be made uniform, but also the vibration-resistance of the terminals 40 can be increased by the stiffness of the ribs (protrusions) 33. Consequently, the vibration resistance of the IGBTs 24, and ultimately of the inverter apparatus 22, can be enhanced.

Moreover, the stiffness of the metal plate 23 can be enhanced efficiently by securing the metal plate 23 with screws to the inverter storage box 11 via the threaded hole 30A formed at a substantially central location of the metal plate 23, in addition to the screws at the above-described four corners. Therefore, stress applied to the terminals 40 of the IGBTs 24 mounted on the metal plate 23 can be reduced, thereby further increasing the vibration resistance of the inverter apparatus 22.

In the present invention, the metal plate 23 may be formed by die-casting instead of pressing as employed in the foregoing embodiment.

In addition, although the IGBTs (power semiconductor switching elements) 24 are secured on the metal plate 23 made of an aluminum alloy in the above-described embodiment, the present invention is not limited to the structure employed in this embodiment. The IGBTs 24 may be secured on the heat-dissipating surface formed on the motor housing 3 via, for example, an insulating sheet.

Furthermore, although the IGBTs (power semiconductor switching elements) 24 are formed as discrete components formed by resin molding in the above-described embodiment, the present invention is not limited to the structure employed in this embodiment. Instead, the IGBTs (power semiconductor switching elements) 24 may be made as bare chips or Metal Oxide Semiconductors (MOS).

In addition, although the suction port 6 is mounted on the side surface at the rear end of the motor housing 3 in this embodiment, the suction port 6 may be provided on the rear end surface of the motor housing 3.

Furthermore, the compressor, which has not been described in detail, may be realized by any type of compressor.

What is claimed is:

1. An inverter-integrated electric compressor for an air-conditioner apparatus of a vehicle, the inverter-integrated electric compressor comprising:
   an electric compressor;
   a housing accommodating the electric compressor;
   an inverter storage box provided on an outer circumference of the housing; and
   an inverter apparatus for converting direct-current power to three-phase alternating-current power and supplying power to an electric motor, the inverter apparatus being integrated with the inverter storage box,
   wherein the inverter apparatus comprises:
   (i) a metal plate secured in the inverter storage box;
   (ii) a plurality of power semiconductor switching elements mounted on the metal plate;
   (iii) a power substrate mounted on the metal plate, the power substrate having thereon a power-related control circuit for operating the power semiconductor switching elements; and
   (iv) a busbar assembly having a plurality of busbars functioning as wiring of the inverter apparatus, each busbar being integrated with an insulator, and
   wherein the metal plate includes a first end and a second end, the first end being spaced apart from the second end in a motor shaft direction of the electric motor,
   wherein the first end of the metal plate is bent to form a first protrusion which protrudes upwardly from the metal plate in a direction of thickness of the metal plate, the first protrusion extending in a width direction perpendicular to the motor shaft direction,
   wherein the second end of the metal plate is bent to form a second protrusion which protrudes upwardly from the metal plate in the direction of thickness of the metal plate, the second protrusion extending in the width direction perpendicular to the motor shaft direction,
   wherein bosses are provided at least three locations on the metal plate by bending upwardly part of the metal plate, and at least one of the bosses is bent in a direction parallel to the first protrusion and the second protrusion, and
   wherein the power substrate is secured to the bosses of the metal plate.

2. The inverter-integrated electric compressor according to claim 1, wherein the first protrusion and the second protrusion are spaced apart from each other at a predetermined interval in the motor shaft direction.

3. The inverter-integrated electric compressor according to claim 2, wherein the first protrusion and the second protrusion are formed by bending the first end and the second end of the metal plate in a direction perpendicular to the motor shaft direction such that each of the first protrusion and the second protrusion protrudes in the direction of thickness of the metal plate.

4. The inverter-integrated electric compressor according to claim 1, wherein the power substrate is secured with screws to the bosses provided at the at least three locations on the metal plate.

5. The inverter-integrated electric compressor according to claim 4, wherein the busbar assembly is secured on the power substrate and is provided between screw positions for securing the power substrate on the metal plate.

6. The inverter-integrated electric compressor according to claim 5, wherein the busbar assembly is L-shaped and is secured along two adjacent sides of the power substrate.

7. The inverter-integrated electric compressor according to claim 1, wherein the plurality of power semiconductor switching elements is arranged such that a plurality of terminals extending from a side surface of each element is arranged in a line, the plurality of terminals being bent upwardly in an L shape.

8. The inverter-integrated electric compressor according to claim 7, wherein the plurality of terminals extending from each of the elements is arranged in a line in a direction parallel to the protrusions.

9. The inverter-integrated electric compressor according to claim 1, wherein the metal plate is secured with screws on a mounting surface of the inverter storage box at least four corners.

10. The inverter-integrated electric compressor according to claim 9, wherein the metal plate is secured with a screw on the mounting surface of the inverter storage box at least at a substantially central location thereof in addition to the four corners.

11. The inverter-integrated electric compressor according to claim 1, wherein the metal plate is made of an aluminum alloy.

12. The inverter-integrated electric compressor according to claim 1,
wherein the plurality of power semiconductor switching elements includes upper-arm switching elements and lower-arm switching elements for phases of a three-phase inverter,
wherein the power semiconductor switching elements are arranged in pairs with one pair corresponding to each phase, and each pair is composed of one of the upper-arm switching elements and one of the lower-arm switching elements, the power semiconductor switching elements being arranged in two columns, each of the two columns extending in a direction perpendicular to the motor shaft direction of the electric motor, and
wherein the upper-arm switching element for each phase in one of the columns and the lower-arm switching element for the same phase in the other of the columns are arranged side by side in a direction parallel to the motor shaft direction.

13. The inverter-integrated electric compressor according to claim 12, wherein the lower-arm switching elements are disposed adjacent to a side where refrigerant gas flowing in the housing is drawn.

14. The inverter-integrated electric compressor according to claim 12, wherein the power semiconductor switching elements are mounted via the metal plate on a heat-dissipating surface formed on the inverter storage box.

15. The inverter-integrated electric compressor according to claim 14, wherein the heat-dissipating surface is finished by cutting processing.

16. The inverter-integrated electric compressor according to claim 14, wherein the heat-dissipating surface is divided into a heat-dissipating surface for the upper-arm switching elements and a heat-dissipating surface for the lower-arm switching elements, and wherein an area therebetween is a non-cutting portion.

17. The inverter-integrated electric compressor according to claim 1, wherein the first protrusion and the second protrusion are configured and arranged to increase the stiffness of the metal plate in the direction perpendicular to the motor shaft direction.

18. The inverter-integrated electric compressor according to claim 1, wherein the metal plate is mounted between the inverter storage box and the power substrate, and each of the first protrusion and the second protrusion extends upwardly toward the power substrate.

19. The inverter-integrated electric compressor according to claim 1, wherein the inverter apparatus further comprises a CPU substrate,
wherein the inverter storage box includes CPU-substrate mounting bosses, and
wherein the CPU substrate is mounted to the CPU-substrate mounting bosses.

20. The inverter-integrated electric compressor according to claim 19, wherein the housing includes a motor housing,
wherein the first protrusion and the second protrusion of the metal plate are disposed between the bosses of the metal plate,
wherein the CPU-substrate mounting bosses and the inverter apparatus are configured such that the power semiconductor switching elements and the power substrate are disposed between the metal plate and the CPU substrate, and
wherein the metal plate is disposed between the motor housing and the CPU substrate.

* * * * *